(12) United States Patent
Phillips

(10) Patent No.: US 9,041,900 B2
(45) Date of Patent: May 26, 2015

(54) HIGH HEAT LOAD OPTICS WITH A LIQUID METAL INTERFACE FOR USE IN AN EXTREME ULTRAVIOLET LITHOGRAPHY SYSTEM

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 1305 days.

(21) Appl. No.: 12/261,798

(22) Filed: Oct. 30, 2008

(65) Prior Publication Data

US 2010/0110397 A1    May 6, 2010

(51) Int. Cl.
| | |
|---|---|
| G03B 27/52 | (2006.01) |
| G02B 7/18 | (2006.01) |
| G02B 5/08 | (2006.01) |
| G03F 7/20 | (2006.01) |
| G21K 1/06 | (2006.01) |

(52) U.S. Cl.
CPC ............ *G02B 7/1815* (2013.01); *G02B 5/0891* (2013.01); *G03F 7/70825* (2013.01); *G03F 7/70891* (2013.01); *G21K 1/06* (2013.01); *G21K 2201/065* (2013.01)

(58) Field of Classification Search
CPC ............ G03F 7/70891; G03F 7/70825; G02B 7/1815; G21K 2201/065
USPC .................. 355/30, 53; 165/104.33; 359/845; 378/34
See application file for complete search history.

(56) References Cited

U.S. PATENT DOCUMENTS

| | | | |
|---|---|---|---|
| 4,003,640 A | 1/1977 | Hansen | |
| 4,190,327 A | 2/1980 | Hughes | |
| 4,443,059 A | 4/1984 | Wells | |
| 5,263,536 A | 11/1993 | Hulburd et al. | |
| 5,276,584 A | 1/1994 | Collins et al. | |
| 6,359,678 B1 | 3/2002 | Ota | |
| 6,880,942 B2 | 4/2005 | Hazelton et al. | |
| 6,989,922 B2 | 1/2006 | Phillips et al. | |
| 7,065,980 B1 | 6/2006 | Knight | |
| 2003/0234993 A1 | 12/2003 | Hazelton et al. | |
| 2006/0176460 A1 | 8/2006 | Phillips | |
| 2006/0181689 A1 | 8/2006 | Phillips | |
| 2007/0091485 A1 | 4/2007 | Phillips et al. | |
| 2007/0211352 A1 | 9/2007 | Phillips | |
| 2008/0003649 A1 | 1/2008 | Maltezos et al. | |
| 2008/0047694 A1* | 2/2008 | Delano et al. ............ | 165/104.33 |
| 2008/0061306 A1 | 3/2008 | Chiu et al. | |

OTHER PUBLICATIONS

International Search Report and Written Opinion for International Application No. PCT/US2009/061902, mailed Dec. 14, 2009.

(Continued)

*Primary Examiner* — Chia-how Michael Liu

(57) ABSTRACT

Methods and apparatus for cooling mirrors in an extreme ultraviolet (EUV) lithography system using a liquid metal interface are described. According to one aspect of the present invention, an apparatus which may be used in an EUV lithography system includes a heat exchanger, a mirror assembly, and a first liquid metal interface. The heat exchanger including at least a first surface. The mirror assembly includes a first mirror block having a first mirrored surface, as well as at least a first well. Finally, the first liquid metal interface includes liquid metal which is contained in the first well. The first surface is in contact with the liquid metal such that heat may be transferred from the first mirror block to the heat exchanger.

28 Claims, 9 Drawing Sheets

(56) References Cited

OTHER PUBLICATIONS

U.S. Appl. No. 11/983,615, entitled "Self-Correcting Optical Elements for High-Thermal-Load Optical Systems", filed Nov. 9, 2007.
The textbook by Yoder, "Optical-Mechanical System Design", Third Edition, pp. 527-553, 2006.
Brauer et al., "Liquid-Metal-Cooled, Curved-Crystal Monochromator for Advanced Photon Source Bending-Magnet Beamline 1-BM", SRI '95 APS X-ray Centennial Symposium/Seventh Users Meeting for the APS, Oct. 16-20, 1995.
Frisch et al., "Advanced Collimator Engineering for the NLC", Proceedings of the 2001 Particle Accelerator Conference, Chicago, 2001.
Smither et al., "Liquid Gallium Cooling of Silicon Crystals in High Intensity Photon Beams (invited)", Rev. Sci. Instrum. 60(7), Jul. 1989.

* cited by examiner

HIGH HEAT LOAD OPTICS WITH A LIQUID METAL INTERFACE FOR USE IN AN EXTREME ULTRAVIOLET LITHOGRAPHY SYSTEM

BACKGROUND OF THE INVENTION

1. Field of the Invention

The present invention relates generally to equipment used in semiconductor processing. More particularly, the present invention relates to an extreme ultraviolet lithography system in which heat is transferred from a mirror to a heat exchanger through a liquid metal interface.

2. Description of the Related Art

Extreme ultraviolet (EUV) lithography is a semiconductor fabrication technology which enables semiconductors with small features, e.g., features with dimensions of approximately 45 nanometers (nm) or less, to be produced. In EUV lithography, a laser may heat xenon gas to create a plasma, although there are other methods used to make EUV plasmas. Electrons come off the plasma and radiate light. FIG. 1 is a block diagram representation of an EUV lithography system. An EUV lithography system 100 includes a vacuum chamber 128 which contains a source 104. Source 104 provides electrons that radiate light, and includes a plasma source 108 and a collector mirror 112 that reflects electrons which come off of the plasma generated by plasma source 108 into an illuminator unit 116b of a body 116 of EUV lithography system 100. Illuminator unit 116b is a condenser that effectively collects light and directs or otherwise focuses the light onto a reticle 120. That is, illuminator unit 116b conditions light from plasma source 108 to improve uniformity. The light reflects off of reticle 120, through projection optics 116a of body 116, and onto a surface of a wafer 124.

Mirrors included in an EUV lithography system generally absorb some of light or radiation that comes into contact with the mirrors. Such mirrors (not shown) may be associated with illuminator unit 116b as well as with projection optics 116a. When light is absorbed by a mirror, the absorbed light is converted to heat. Heat generally causes distortion in the mirror, thereby degrading the optical performance of the mirror. When there is distortion in the mirror, the optical performance of the mirror is compromised.

The removal of heat from the mirrors is critical to ensure that an EUV lithography system performs with accuracy. When mirrors become heated, the mirrors may become distorted. The distortion of mirrors reduces the accuracy with which an EUV lithography system may perform.

Often, radiation is used to provide cooling to mirrors. Although radiant cooling methods may be effective in cooling mirrors while causing a relatively insignificant amount of distortion in the mirrors, when the heat load on a mirror is relatively high, radiant cooling methods are often inadequate for cooling mirrors. By way of example, radiant cooling methods are often inadequate when mirror temperatures and heat sink temperatures are not allowed to deviate greatly from the overall system temperature. In particular, radiant cooling methods generally do not provide sufficient cooling when higher power densities are involved.

Internal or direct cooling methods, e.g., liquid cooling methods, may be applied to mirrors to provide cooling in the presence of relatively high heat loads. Conventional internal cooling methods are typically associated with turbulent flow, as turbulent flow provides for relatively efficient heat transfer and cooling. However, the use of turbulent or non-laminar flow to cool a mirror generally causes the mirror to vibrate. When a mirror vibrates, the vibrations caused by the turbulent flow may effectively adversely affect a lithography process, particularly if the vibrations cause a heat exchanger, an illuminator unit, projection optics, a reticle, or a wafer to vibrate. By way of example, the accuracy of the EUV lithography process may be compromised when optics vibrate or are otherwise distorted.

An EUV lithography process preferably uses efficient, high performance heat exchangers and low complexity, low cost mirror assemblies. Mirror assemblies that are relatively complex are difficult to exchange, e.g., because coolant paths to the mirror assemblies are substantially severed in order to exchange mirror assemblies. In general, however, internally cooled mirrors designed for vacuum environments are relatively complex and expensive.

Therefore, what is needed is a relatively low cost method and an apparatus which allows heat to be efficiently removed from a mirror used in a EUV lithography system without adversely affecting the accuracy of a EUV lithography process. That is, what is desired is a method and an apparatus which efficiently removes heat from a mirror used in a EUV lithography system while substantially minimizing vibrations transmitted to optical elements which are structurally connected to the mirror.

SUMMARY OF THE INVENTION

The present invention pertains to removing heat from a mirror of a lithography system. The present invention may be implemented in numerous ways, including, but not limited to, as a method, system, device, or apparatus. Example embodiments of the present invention are discussed below.

According to one aspect of the present invention, an apparatus which may be used in an extreme ultraviolet (EUV) lithography system includes a heat exchanger, a mirror assembly, and a first liquid metal interface. The heat exchanger including at least a first surface. The mirror assembly includes a first mirror block having a first mirrored surface, as well as at least a first well. Finally, the first liquid metal interface includes liquid metal which is contained in the first well. The first surface is in contact with the liquid metal such that heat may be transferred form the first mirror block to the heat exchanger. In one embodiment, the mirror assembly includes a base plate that is coupled to the first mirror block.

According to another aspect of the present invention, an apparatus which may be used in a EUV lithography system includes a heat exchanger in which at least one well is defined. The apparatus also includes a mirror assembly and a liquid metal interface. The mirror assembly has a mirror block with a mirrored surface, and also has at least one surface. The liquid metal interface including liquid metal contained in the well. The surface is in contact with the liquid metal to transfer heat from the mirror block to the heat exchanger.

In accordance with still another aspect of the present invention, a method for assembling a cooling apparatus in a EUV lithography system includes obtaining a mirror assembly which has at least one cavity defined therein. The method also includes at least partially filling the cavity with a liquid metal, and positioning at least one surface of a heat exchanger in the cavity. Positioning the surface of the heat exchanger in the cavity includes causing the surface to contact the liquid metal.

According to yet another aspect of the present invention, a method for cooling a mirrored arrangement in a lithography device includes transferring a heat load from a mirrored surface of the mirror arrangement to a liquid metal interface. The liquid metal interface is located between the mirror arrangement and a heat exchanger. The method also includes transferring the heat load from the liquid metal interface to at least a first surface of the heat exchanger.

Other aspects and advantages of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, in which.

DETAILED DESCRIPTION OF THE INVENTION

Example embodiments of the present invention are discussed below with reference to the various figures. However, those skilled in the art will readily appreciate that the detailed description given herein with respect to these figures is for explanatory purposes, as the invention extends beyond these embodiments.

The performance of an extreme ultraviolet (EUV) lithography system may be compromised if vibrations are present within the system. As such, an arrangement which is intended to remove a heat load from a mirror that is coupled to an optical element of a EUV lithography system preferably removes the heat load substantially without increasing vibrations within the system.

In one embodiment, heat is transferred from a mirror block to a heat exchanger a EUV lithography system through a liquid metal interface. The liquid metal interface may be arranged as liquid metal contained in a cavity or a well formed in the mirror block. The liquid metal relatively efficiently transfers heat from a mirror, e.g., a mirrored surface of a mirror block, to the heat exchanger. The liquid metal also provides a relatively low stiffness interface that substantially isolates the mirror, as well as optical elements connected to the mirror, from vibrations, e.g., vibrations of a vacuum chamber, which travel through coolant hoses associated with a EUV lithography system.

At times, mirrors within a EUV lithography system may be replaced. To facilitate the replacement of mirrors within a vacuum chamber of a EUV lithography system, an overall mirror assembly may be formed from a "removable" mirror block and a base plate that is substantially fixed to an optical element. Such a mirror assembly effectively allows a mirror to be readily separated from a heat exchanger. The mirror block, or multiple mirror blocks, may be coupled to the base plate such that the mirror block may be readily replaced or otherwise exchanged. By way of example, the mirror block may be replaced substantially without the need for detaching hoses or other connections associated with a heat exchanger. As such, mirror replacement may effectively occur without causing the leakage of gas or fluids into a vacuum environment. Hence, the replacement of mirrors does not contaminate the vacuum environment.

Figure 1:
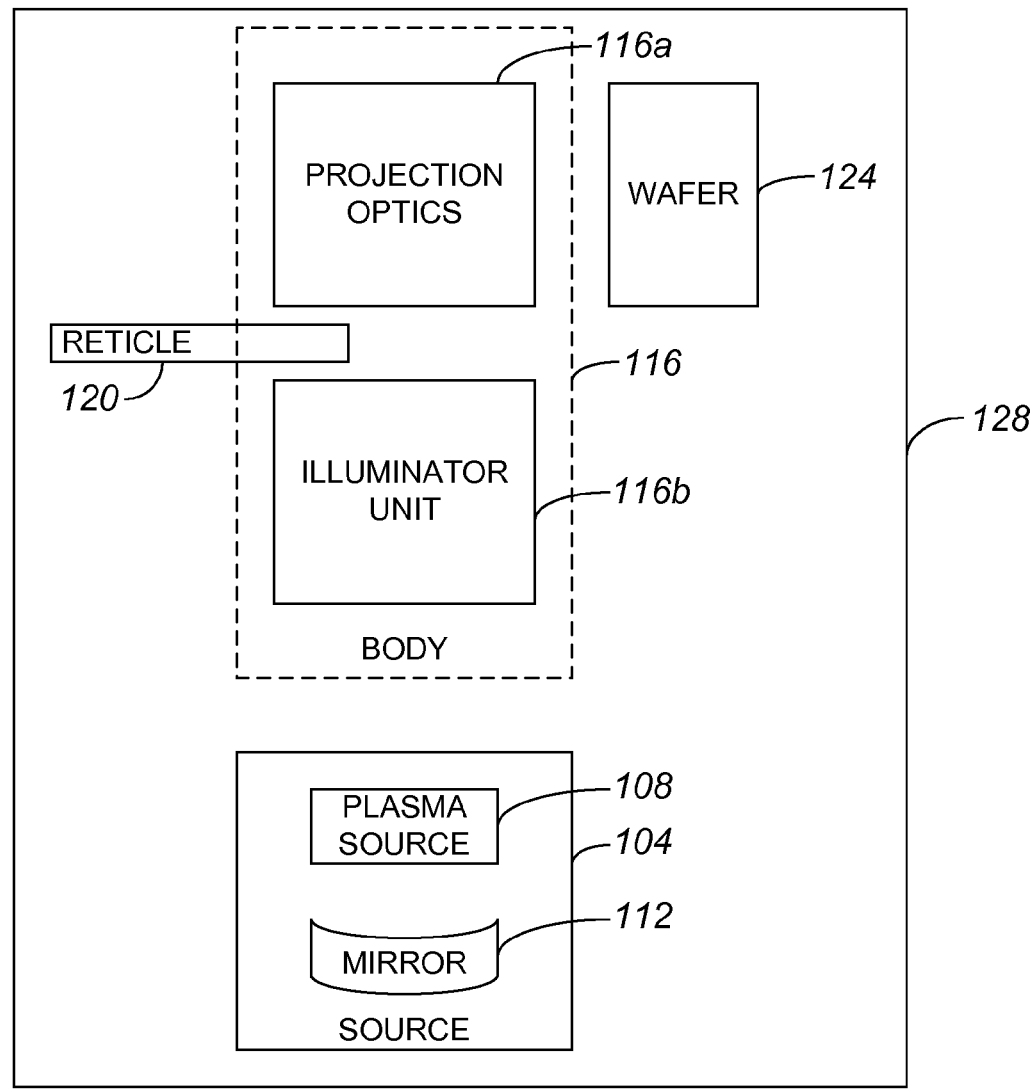
FIG. 1 is a block diagram representation of an extreme ultraviolet (EUV) lithography system.
Figure 2:
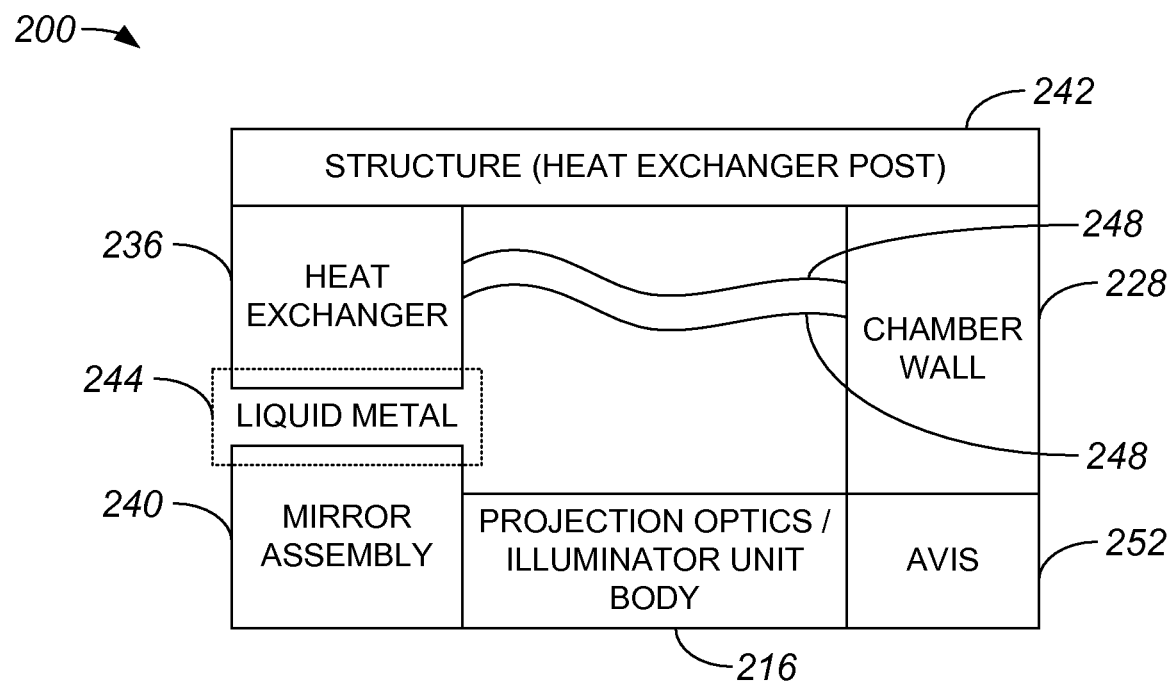
FIG. 2 is a diagrammatic representation of a portion of a EUV lithography system which includes a liquid metal interface between a heat exchanger and a mirror in accordance with an embodiment of the present invention.

With reference to FIG. 2, a EUV lithography system which includes a liquid metal interface between a heat exchanger and a mirror assembly will be described in accordance with an embodiment of the present invention. A EUV lithography system 200 includes a vacuum chamber which has a chamber wall 228. Chamber wall 228 is generally coupled to an active vibration isolation system (AVIS) 252 which is configured to isolate a projection optics/illuminator unit PO/IU body 216 from external vibrations, e.g., ground vibrations or stage vibrations. It should be appreciated that chamber wall 228 may generally be substantially grounded, or otherwise coupled to an external ground surface.

PO/IU body 216 has optical elements of EUV lithography system 200 which are sensitive to vibrations. In one embodiment, PO/IU body 216 is coupled to AVIS 252 such that AVIS 252 may reduce the vibrations transmitted to PO/IU body 216.

A heat exchanger 236 is coupled to chamber wall 228 via a structure 242, e.g., a heat exchanger post. In other words, heat exchanger is relatively rigidly coupled to chamber wall 228 through structure 242. Coolant hoses 248 pass between heat exchanger 236 and chamber wall 228. Coolant hoses 248 provide cooled fluid to heat exchanger 236, which is located in a vacuum held by chamber wall 228, and also remove heated fluid from heat exchanger 236.

A mirror assembly 240 is coupled to PO/IU body 216. As will be appreciated by those skilled in the art, mirror assembly 240 and PO/IU body 216 are within a vacuum contained by chamber wall 228. Heat exchanger 236 is not in direct contact with mirror assembly 240. A liquid metal interface 244 allows a heat load in mirror assembly 240 to pass to heat exchanger 236. That is, liquid metal interface 244 is arranged to effectively provide a substantially indirect connection between mirror assembly 240 and heat exchanger 236. As such, heat exchanger 236 is substantially vibrationally isolated from mirror assembly 240 and from PO/IU body 216. When heat exchanger 236 is vibrationally isolated from PO/IU body 216, the use of a turbulent flow in heat exchanger 236 may improve the efficiency of heat exchanger 236 substantially without imparting significant vibrations on PO/IU body 216. It should be appreciated that the transmission of vibrations through heat exchanger 236 from other sources including, but not limited to including, coolant hoses 248, stages (not shown), and a ground (not shown) may also be substantially attenuated.

Liquid metal interface 244 includes liquid metal that is in contact with both mirror assembly 240 and heat exchanger 236. As will be discussed below, liquid metal interface 244 may include amounts of liquid metal substantially contained within a cavity, well, groove, or trough in mirror assembly 240.

Figure 3:
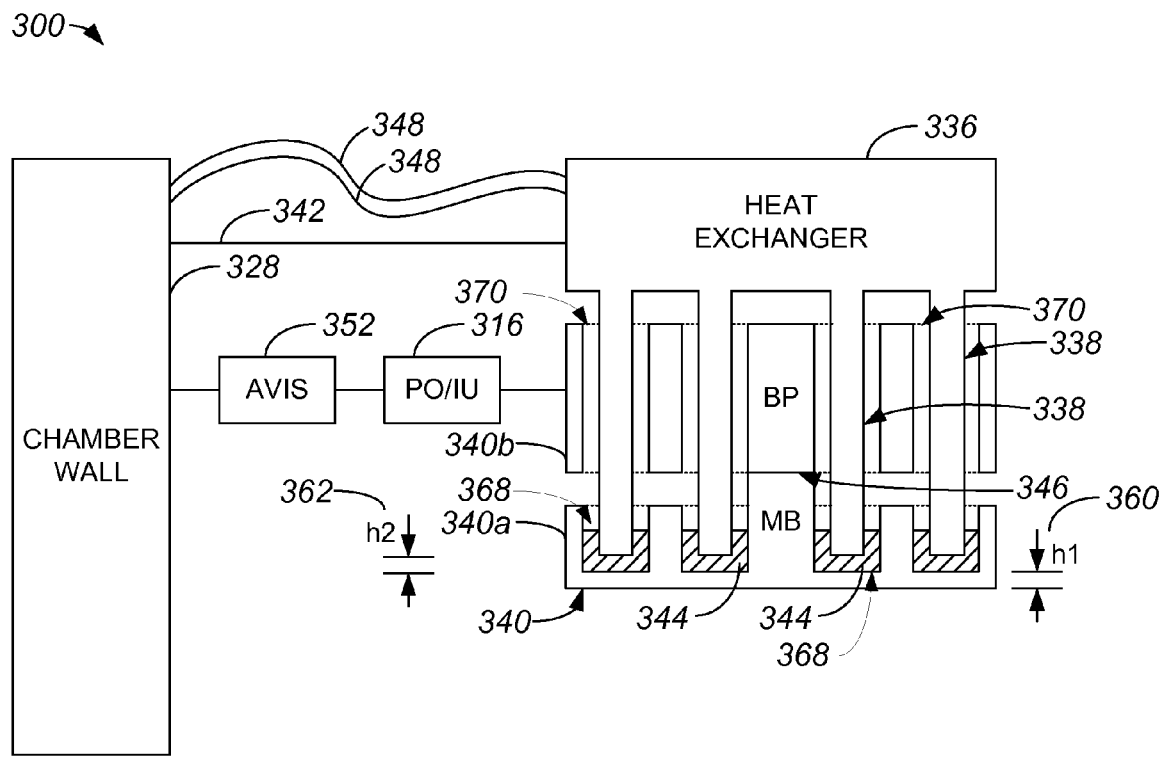
FIG. 3 is a diagrammatic representation of a heat exchanger, a base plate, and at least one mirror block which contains liquid metal in accordance with an embodiment of the present invention.

Referring next to FIG. 3, one EUV lithography system which includes a heat exchanger, a base plate, and at least one mirror block which contains liquid metal will be described in accordance with an embodiment of the present invention. A EUV lithography system 300 includes a vacuum chamber with a chamber wall 328. Chamber wall 328 is coupled to an AVIS 352. AVIS 352 is further coupled to a PO/IU body 316. Chamber wall 328 is also relatively rigidly coupled to heat exchanger 336 through a heat exchange post 342. Hoses 348, which carry coolant to and from heat exchanger 336, are arranged to pass between chamber wall 328 and heat exchanger 336.

A mirror assembly 340 and heat exchanger 336 associated with EUV lithography system 300 are arranged such that mirror assembly 340 and heat exchanger 336 are not in direct contact. In the described embodiment, a mirror assembly 340 includes at least two components, e.g., at least one mirror block 340a and a base plate 340b, which are removably coupled at an interface 346 that effectively serves as a quasi-kinematic mount. For ease of illustration, a single mirror block 340a is shown. Forming mirror assembly 340 from separate components allows base plate 340b to be substantially isolated from distortions in mirror block 340a. Base plate 340b is arranged to be relatively rigidly, but removably, coupled to PO/IU body 316. When mirror block 340a is to be exchanged or otherwise replaced, mirror block 340a and base plate 340b are disconnected from PO/IU body 316, while heat exchanger 336 is substantially unaffected.

Mirror block 340a includes a rib portion which is coupled to base plate 340b at interface 346. Mirror block 340a may generally be formed from substantially any material that may support a mirrored surface. A mirrored surface may generally be polished onto mirror block 340a, or may be attached to mirror block 340a. Mirror block 340a may be formed from materials including, but not limited to including, copper, molybdenum, silicon, and substantially any materials which have similar, relatively high figures of merit. Mirror block 340a may also be formed from any suitable materials that are coated such that mirror block 340a is unlikely to corrode when in contact with liquid metal 344 contained within wells 368 defined in mirror block 340a. Additionally, mirror block 340a may be formed from more than one type of metal in order to provide temperature dependent curvature compensation.

Base plate 340b may be formed from materials including, but not limited to including, ceramic materials and metals, e.g., metals with low thermal expansion properties. In general, base plate 340b includes perforations or openings 370 which align with wells 368 in mirror block 340a. Protrusions or prongs 338 of heat exchanger 336 are arranged to pass through openings 370 and into wells 368. It should be appreciated that both the number of prongs 338 and the size of prongs 338 associated with heat exchanger 336 may vary widely. Within wells 368, prongs 338 typically come into direct contact with liquid metal 344. A heat load associated with mirror block 340a may be transferred to surfaces, e.g., bottom surfaces, of prongs 338 through liquid metal 344.

A distance h1 360 between a bottom surface of mirror block 340a and a bottom surface of well 368 is generally relatively small, as for example in the range between approximately one millimeter (mm) and approximately three mm. A distance h2 362 represents a gap between a bottom surface of well 368 and a bottom surface of prong 338. Distance h2 362 is typically as small as feasible, while still accounting for potential positioning tolerances associated with the positioning of prongs 338 within wells 368. Maintaining distance h2 362 as small as possible while still substantially preventing prongs 338 from coming into physical contact with the sides of wells 368 allows heat to be efficiently transferred from mirror block 340a to heat exchanger 340b through liquid metal 344. In one embodiment, distance h2 362 is greater than approximately one mm.

Figure 4:
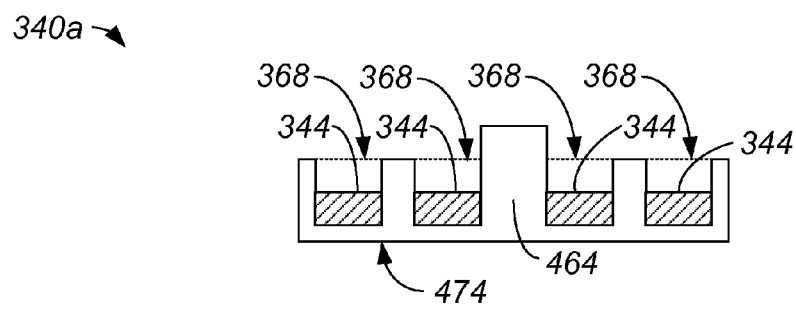
FIG. 4 is a diagrammatic cross-sectional side-view representation of a mirror block, e.g., mirror block 340a of FIG. 3, which contains liquid metal in accordance with an embodiment of the present invention.

With reference to FIG. 4, mirror block 340a will be described in more detail. FIG. 4 is a diagrammatic cross-sectional side-view representation of mirror block 340a which contains liquid metal in accordance with an embodiment of the present invention. Mirror block 340a includes wells 368 that contain liquid metal 344. Mirror block 340a also includes a rib 464 which may be used to couple mirror block 340a to a base plate (not shown).

Liquid metal 344 contained in wells 368 may be a pure gallium liquid metal, or a gallium alloy liquid metal such as indium gallium or gallium indium tin. The liquid metal 344 contained in wells 368 effectively form a liquid metal interface. The amount of liquid metal 344 contained in wells 368 may vary widely, as for example based on the requirements of a particular EUV system in which mirror block 340a is to be used.

A surface 474 of mirror block 340a which, as shown, may be a bottom surface of mirror block 340a, is a mirrored surface. Surface 474 may become heated and, hence, carry a heat load. A heat load borne by surface 474 may pass to liquid metal 344 and, subsequently, from liquid metal 344 to a heat exchanger (not shown).

Figure 5A:
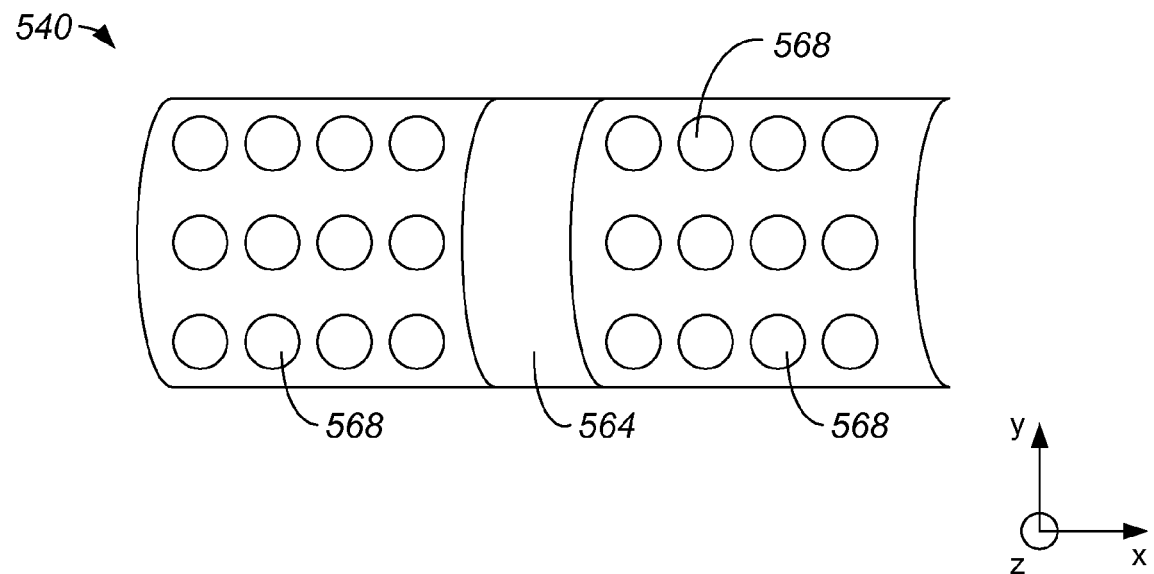
FIG. 5A is a top-view representation of a mirror block in accordance with an embodiment of the present invention.
Figure 5B:
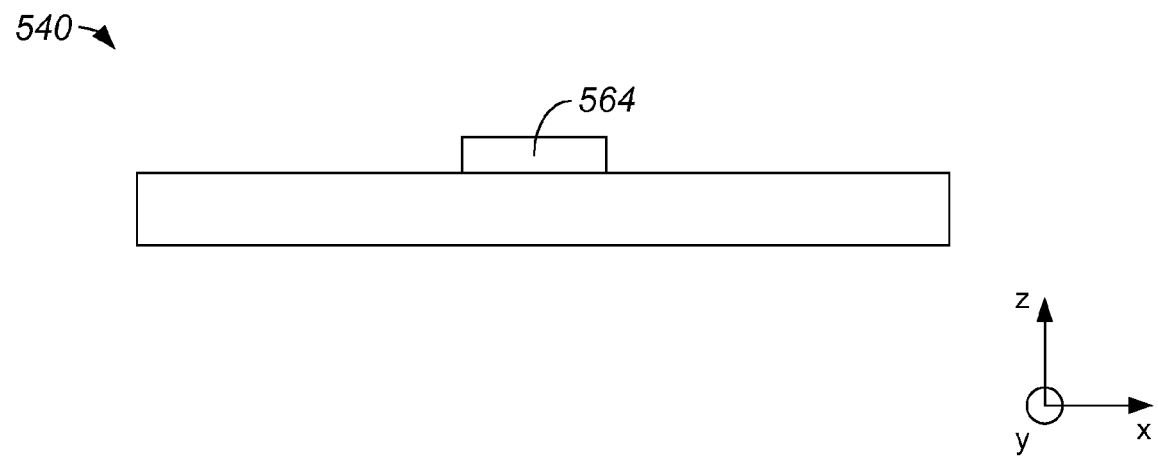
FIG. 5B is a side-view representation of a mirror block, e.g., mirror block 540 of FIG. 5A, in accordance with an embodiment of the present invention.

In general, the size of a mirror block, the number of wells defined within the mirror block, and the dimensions of the wells may vary widely. Further, the number of mirror blocks coupled to each base plate may vary, e.g., depending upon the requirements of particular EUV lithography system. It should be appreciated that each mirror block that is coupled to a single base plate may have a different configuration. FIGS. 5A and 5B are top-view and side view representations, respectively, of one mirror block in accordance with an embodiment of the present invention. A mirror block 540 includes a rib 564 that is used to mount mirror block 540 to a base plate (not shown). Mirror block 540 includes at least one well 568. The number of wells 568, the size of wells 568, and the layout of wells 568 in mirror block 564 may depend on a number of different factors. For example, the layout of prongs of a heat exchanger (not shown), the size of such prongs, and the number of such prongs may be a factor in determining the overall configuration of mirror block 540.

Figure 6:
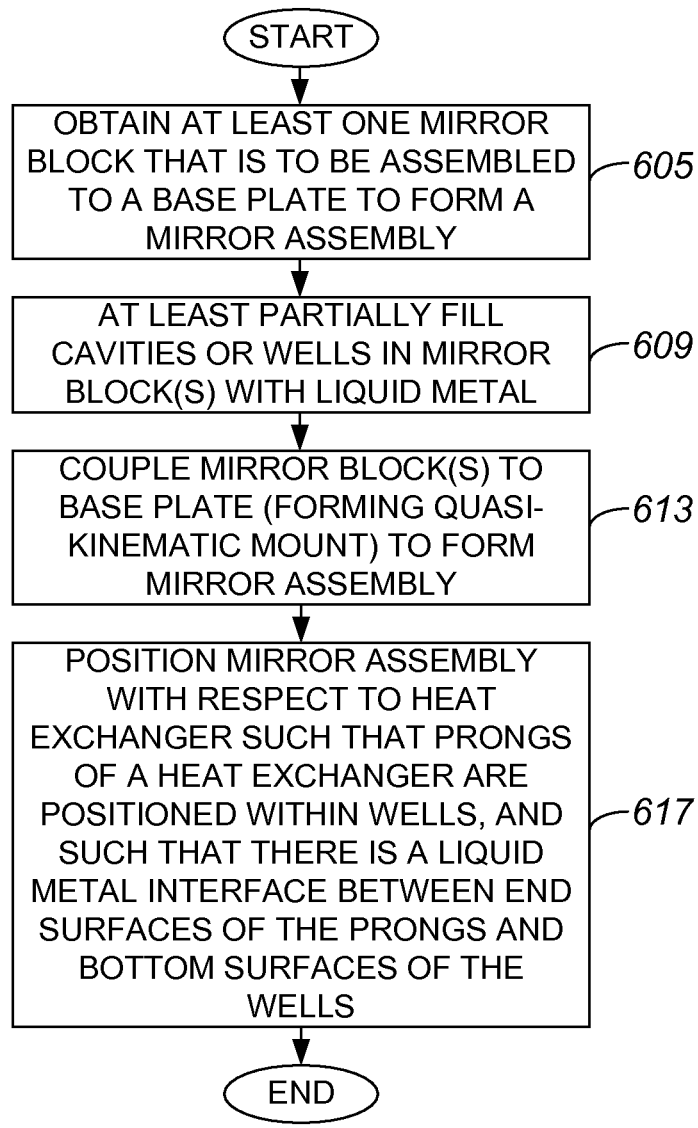
FIG. 6 is a process flow diagram which illustrates a method of assembling a system which allows heat to be transferred from a mirror block to a heat exchanger in accordance with an embodiment of the present invention.

As previously mentioned, an overall mirror assembly of a EUV lithography system includes a base plate and at least one mirror block. FIG. 6 is a process flow diagram which illustrates a method of assembling a system which allows heat to be transferred from a mirror block to a heat exchanger in accordance with an embodiment of the present invention. A process 601 of assembling a system begins at step 605 in which components of a mirror assembly are obtained. That is, a base plate and at least one mirror block which is arranged to be mounted to the base place are obtained.

After the components of the mirror assembly are obtained, cavities or wells of the mirror block or blocks are at least partially filled in step 609 with liquid metal. Once liquid metal is provided into the wells, the mirror block or blocks and the base plate are coupled in step 613 to form the mirror assembly. The coupling between a base plate and a mirror block forms a quasi-kinematic mount. Perforations in base plate are aligned with wells in the mirror block or blocks when a quasi-kinematic coupling or couplings are formed.

In step 613, the mirror assembly is positioned with respect to the heat exchanger such that the heat exchanger comes into contact with the liquid metal. With the heat exchanger and bottom surfaces of wells in contact with the liquid metal, the liquid metal effectively forms an interface between the heat exchanger and the mirror assembly or, more specifically, the mirror block or blocks. In one embodiment, prongs of the heat exchanger are located within the wells such that at least a surface, e.g., a bottom surface, of the prongs comes into contact with the liquid metal within the wells. The process of assembling a system is completed once the mirror assembly is positioned with respect to the heat exchanger such that a liquid metal interface is formed.

Figure 7:
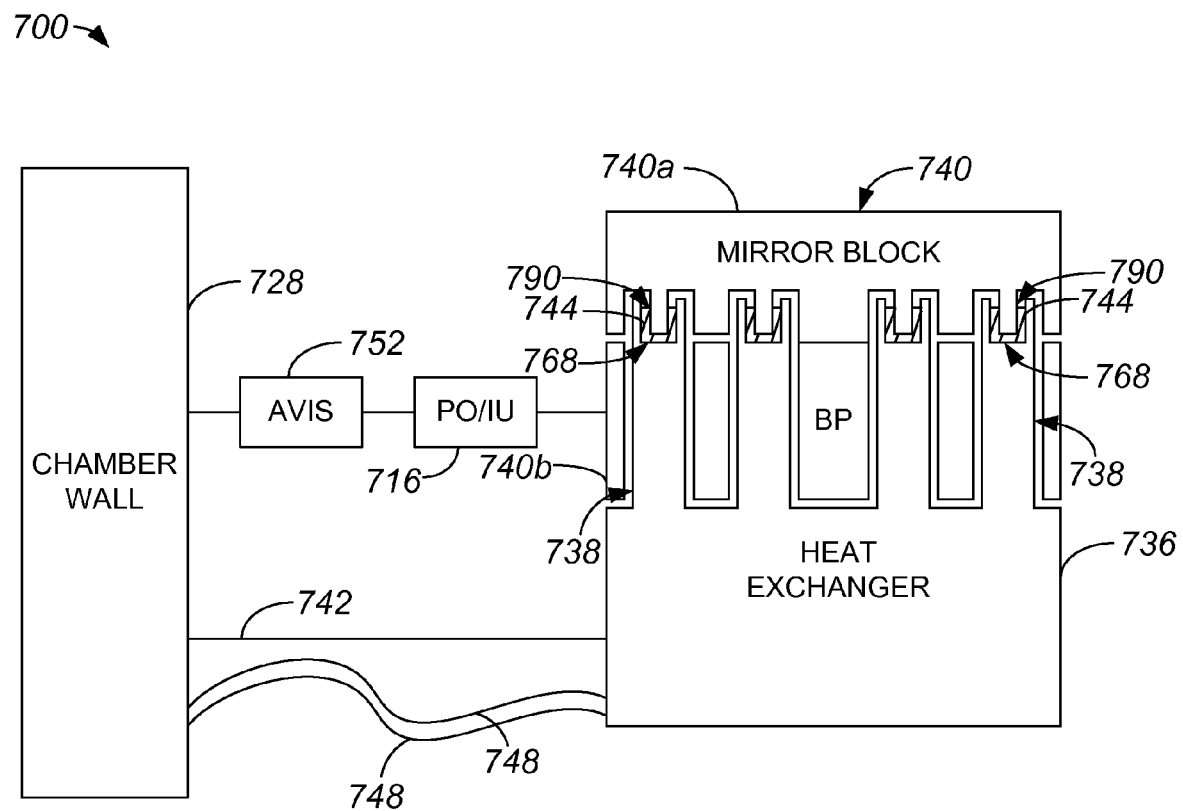
FIG. 7 is a diagrammatic representation of a base plate, a mirror block, and a heat exchanger which contains liquid metal in accordance with an embodiment of the present invention.

A liquid metal interface has generally been described as being formed from liquid metal contained in wells of a mirror assembly, e.g., wells defined in a mirror block of a mirror assembly. It should be appreciated, however, that wells which contain liquid metal may instead be formed in a heat exchanger, or in another part of a mirror assembly, e.g., in a base plate of a mirror assembly. FIG. 7 is a diagrammatic representation of a EUV lithography system which includes a base plate, a mirror block, and a heat exchanger which has wells in which liquid metal is contained in accordance with an embodiment of the present invention. A EUV lithography system 700 includes a vacuum chamber with a chamber wall 728. An AVIS 752 is coupled to chamber wall 728, as well as to a PO/IU body 716. Chamber wall 728 is also relatively rigidly coupled to heat exchanger 736 through a heat exchange post 742. Hoses 748, which carry coolant to and from heat exchanger 736, are arranged to pass between chamber wall 728 and heat exchanger 736.

In the described embodiment, a mirror assembly 740 includes at least one mirror block 740a and a base plate 740b, which are removably coupled at an interface 746 that effectively serves to form a quasi-kinematic mount. To exchange or otherwise replace mirror block 740a, mirror block 740a and base plate 740b may be disconnected from PO/IU body 716, substantially without affecting a heat exchanger 736 that is arranged to cool, or otherwise remove heat from, mirror block 740a.

Heat exchanger 736 includes prongs 738 in which wells 768 are formed. Wells 768 are arranged to contain liquid metal 744. Mirror block 740a includes prongs 790 which are arranged to come into contact with liquid metal 744 contained in wells 768. Hence, liquid metal 744 effectively forms an interface between surfaces of wells 768 and surfaces of prongs 790. Such an interface allows a heat load on mirror block 740a to be transferred to heat exchanger 736.

Figure 8:
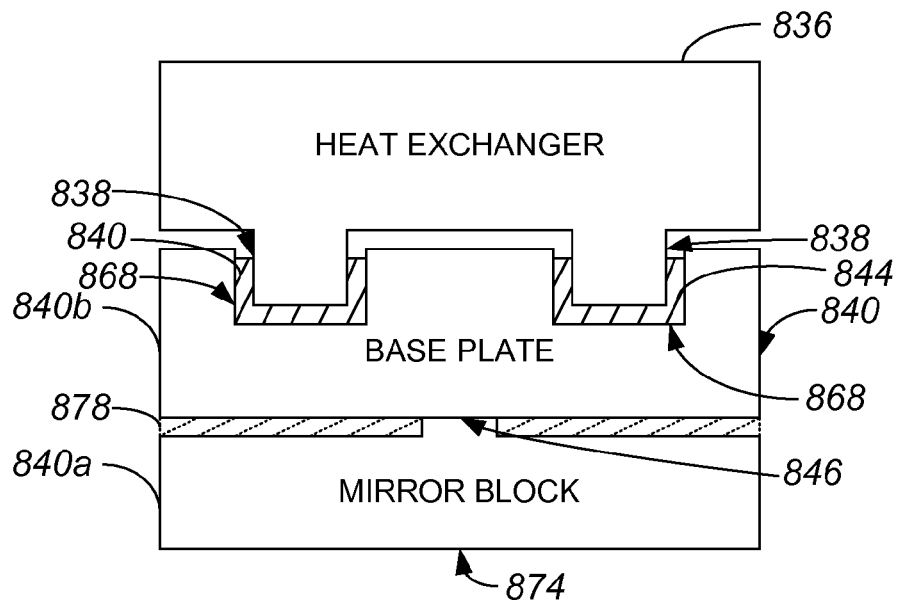
FIG. 8 is a diagrammatic representation of a mirror block, a heat exchanger, and a base plate which contains liquid metal in accordance with an embodiment of the present invention.

As previously mentioned, wells which contain liquid metal may be defined in a base plate, rather than in a mirror block or a heat exchanger. FIG. 8 is a diagrammatic representation of a mirror block, a heat exchanger, and a base plate in which wells are defined in accordance with an embodiment of the present invention. An assembly 888 includes a heat exchanger 836 and a mirror assembly 840. Mirror assembly 840 includes at least one mirror block 840a and a base plate 840b. As shown, mirror assembly 840 includes a single mirror block 840a for ease of illustration.

Mirror block 840a and base plate 840b are coupled at an interface 846 which may be a quasi-kinematic mount. To enhance heat transfer between mirror block 847 and base plate 840, a material 878 may optionally be provided between mirror block 840a and base plate 840b. Such material may be a relatively soft material such as Indium. It should be understood, however, that any relatively soft, compliant material may be provided between mirror block 840a and base plate 840b.

Base plate 840b includes wells 868 in which liquid metal 844 is provided. Prongs 838 of heat exchanger 836 are located within wells 868 such that surfaces of prongs 838 come into contact with liquid metal 844. Hence, a heat load on mirror block 840a is transferred to base plate 840b, which then conducts the heat load through liquid metal 844 to heat exchanger 836.

A EUV lithography system according to the above-described embodiments, e.g., a lithography apparatus which may include a liquid metal interface between a mirror block and a heat exchanger, may be built by assembling various subsystems in such a manner that prescribed mechanical accuracy, electrical accuracy, and optical accuracy are maintained. In order to maintain the various accuracies, prior to and following assembly, substantially every optical system may be adjusted to achieve its optical accuracy. Similarly, substantially every mechanical system and substantially every electrical system may be adjusted to achieve their respective desired mechanical and electrical accuracies. The process of assembling each subsystem into a photolithography system includes, but is not limited to, developing mechanical interfaces, electrical circuit wiring connections, and air pressure plumbing connections between each subsystem. There is also a process where each subsystem is assembled prior to assembling a photolithography system from the various subsystems. Once a photolithography system is assembled using the various subsystems, an overall adjustment is generally performed to ensure that substantially every desired accuracy is maintained within the overall photolithography system. Additionally, it may be desirable to manufacture an exposure system in a clean room where the temperature and humidity are controlled.

Figure 9:
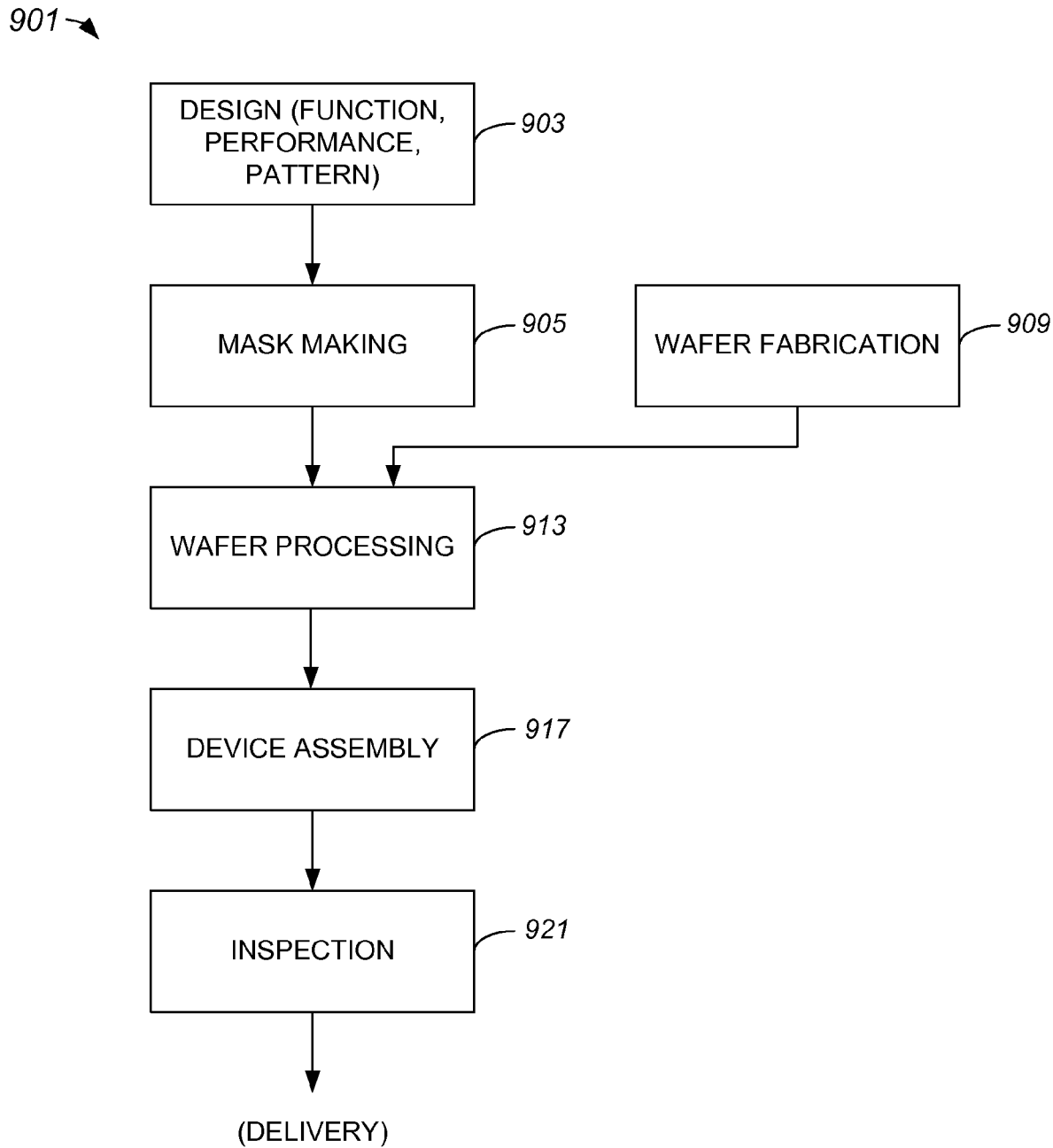
FIG. 9 is a process flow diagram which illustrates the steps associated with fabricating a semiconductor device in accordance with an embodiment of the present invention.

Further, semiconductor devices may be fabricated using systems described above, as will be discussed with reference to FIG. 9. FIG. 9 is a process flow diagram which illustrates the steps associated with fabricating a semiconductor device in accordance with an embodiment of the present invention. A process 901 of fabricating a semiconductor device begins at step 903 in which the function and performance characteristics of a semiconductor device are designed or otherwise determined. Next, in step 905, a reticle or mask in which has a pattern is designed based upon the design of the semiconductor device. It should be appreciated that in a substantially parallel step 909, a wafer is typically made from a silicon material. In step 913, the mask pattern designed in step 905 is exposed onto the wafer fabricated in step 909 through the use of an EUV lithography system. One process of exposing a mask pattern onto a wafer will be described below with respect to FIG. 10. In step 917, the semiconductor device is assembled. The assembly of the semiconductor device generally includes, but is not limited to including, wafer dicing processes, bonding processes, and packaging processes. Finally, the completed device is inspected in step 921. Upon successful completion of the inspection in step 921, the completed device may be considered to be ready for delivery.

Figure 10:
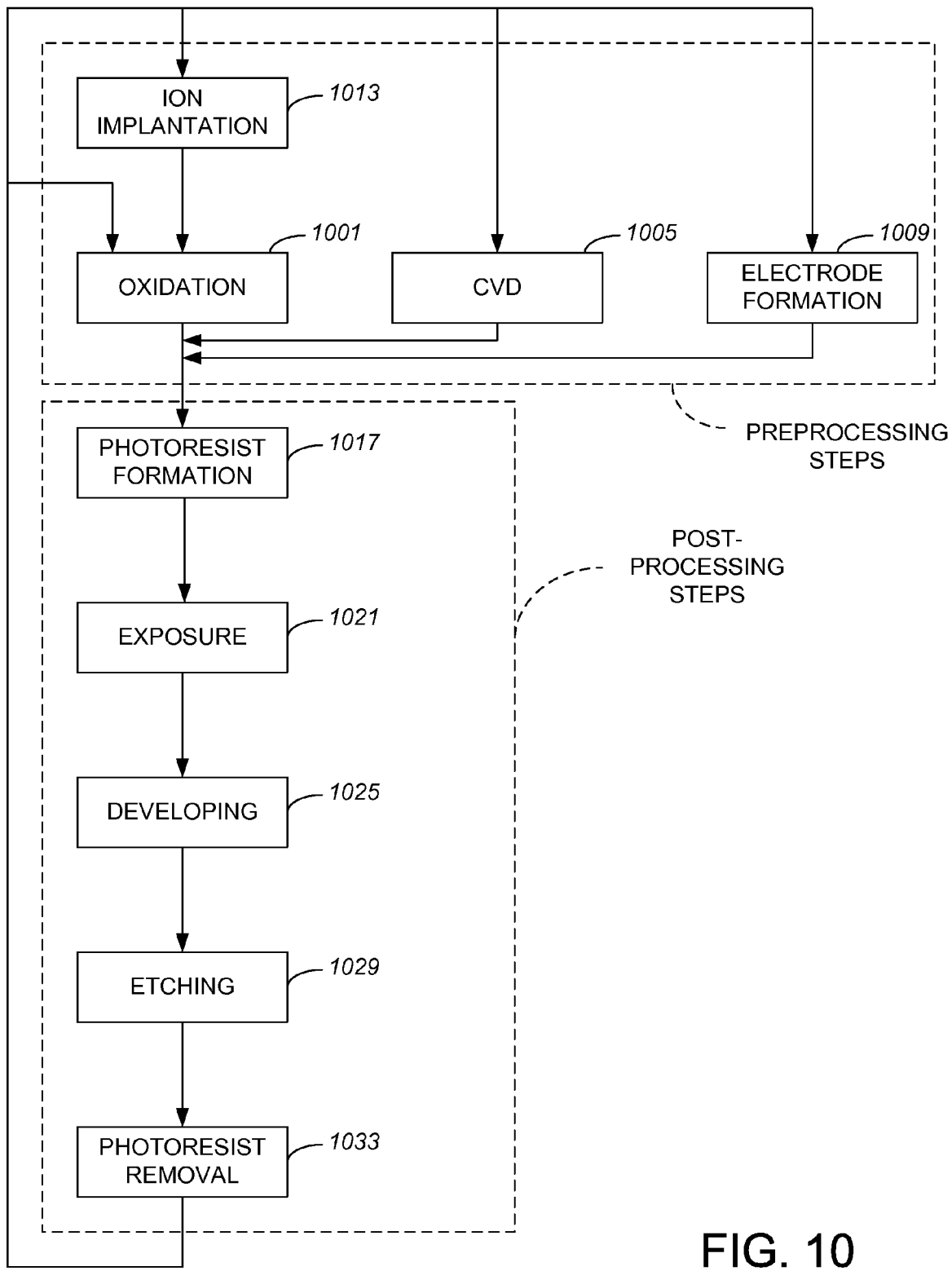
FIG. 10 is a process flow diagram which illustrates the steps associated with processing a wafer, i.e., step 904 of FIG. 9, in accordance with an embodiment of the present invention.

FIG. 10 is a process flow diagram which illustrates the steps associated with wafer processing in the case of fabricating semiconductor devices in accordance with an embodiment of the present invention. In step 1001, the surface of a wafer is oxidized. Then, in step 1005 which is a chemical vapor deposition (CVD) step in one embodiment, an insulation film may be formed on the wafer surface. Once the insulation film is formed, then in step 1009, electrodes are formed on the wafer by vapor deposition. Then, ions may be implanted in the wafer using substantially any suitable method in step 1013. As will be appreciated by those skilled in the art, steps 1001-1013 are generally considered to be preprocessing steps for wafers during wafer processing. Further, it should be understood that selections made in each step, e.g., the concentration of various chemicals to use in forming an insulation film in step 1005, may be made based upon processing requirements.

At each stage of wafer processing, when preprocessing steps have been completed, post-processing steps may be implemented. During post-processing, initially, in step 1017, photoresist is applied to a wafer. Then, in step 1021, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1025. Once the exposed wafer is developed, parts other than residual photoresist, e.g., the exposed material surface, may be removed by etching in step 1029. Finally, in step 1033, any unnecessary photoresist that remains after etching may be removed. As will be appreciated by those skilled in the art, multiple circuit patterns may be formed through the repetition of the preprocessing and post-processing steps.

Figure 11:
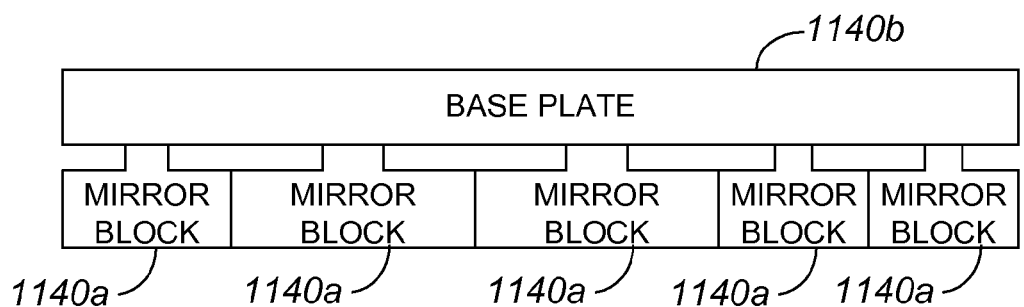
FIG. 11 is a block diagram representation of a mirror assembly which includes multiple mirror blocks in accordance with an embodiment of the present invention.

As mentioned above, a mirror assembly may include a base plate and multiple mirror blocks. FIG. 11 is a block diagram representation of a mirror assembly which includes multiple mirror blocks in accordance with an embodiment of the present invention. A mirror assembly 1140 includes a plurality of mirror blocks 1140a. In general, the number of mirror blocks 1140a included in mirror assembly may vary widely. Further, mirror blocks 1140a may be substantially uniform, e.g., mirror blocks 1140a may have substantially the same dimensions, or mirror blocks 1140a may be non-uniform, e.g., mirror blocks 1140a may have different dimensions, as shown.

Each mirror block 1140a is coupled to a shared base plate 1140b. The use of multiple mirror blocks 1140a rather than a single mirror block 1140a in mirror assembly 1140 reduces the amount by which base plate 1140b may bend. That is, the use of multiple mirror blocks 1140a rather than a single mirror block 1140a may reduce the amount of thermal distortion associated with base plate 1140b.

Although only a few embodiments of the present invention have been described, it should be understood that the present invention may be embodied in many other specific forms without departing from the spirit or the scope of the present invention. By way of example, in lieu of liquid metal, other compositions with properties which are similar to liquid metal may be used to form an interface between a mirror and a heat exchanger through which heat may be conducted or otherwise transferred. Compositions with similar properties to liquid metal may include, but are not limited to including, liquids which will not significantly outgas or evaporate at or around the temperature maintained in a vacuum chamber of an EUV lithography system. Such liquids may have a relatively low vapor pressure.

A rib has been described as being a suitable structure for substantially coupling a mirror block to a base plate. It should be appreciated, however, that a rib is but one example of a suitable structure that may be used to effectuate a coupling between a mirror block and a base plate. In one embodiment, for example, a round boss may be used to substantially couple a mirror block to a base plate.

While a mirror assembly has been described as having at least one mirror block that is removably coupled to a shared base plate, a mirror assembly may instead be integrally formed. That is, a mirror assembly may include at least one mirror block and a base plate that are integrally, or substantially irremovably, coupled.

A mirror block of the present invention typically does not include internal cooling passages, as a liquid metal interface conducts heat from the mirror block to a heat exchanger and, therefore, cools mirror block. However, it should be appreciated that a mirror block may also include internal cooling passages.

A base plate has been described as having multiple mirror blocks coupled thereto. While multiple mirror blocks have been described as being coupled to a base plate, it should be appreciated that a single mirror block may be coupled to a base plate. In general, any number of mirror blocks may be coupled to a base plate.

In addition, the shape of a base plate and the location of a base plate relative to a mirror block may vary widely. By way of example, a base plate may be formed as a ring that is arranged to substantially surround the periphery of a mirror block. When the base plate is a ring that substantially surrounds the periphery of a mirror block, quasi-kinematic mounts may be formed or otherwise located substantially between the ring and the periphery of the mirror block.

Further, the configuration of a mirror block may vary widely. For instance, the number of wells, the position of the wells, and/or the size of the wells may vary depending upon the requirements or specifications associated with a given EUV lithography process.

A base plate and a mirror block have generally been described as being substantially separate but coupled. It should be appreciated, however, that a base plate and a mirror block may be integrally formed without departing from the spirit or the scope of the present invention.

In one embodiment, a temperature gradient associated with a liquid metal interface is arranged to be substantially normal to the surface of a mirror. A configuration in which a temperature gradient of the liquid metal interface is substantially normal to the surface of the mirror may yield an approximately maximum heat transfer efficiency between the mirror and an associated heat exchanger. It should be appreciated, however, that the temperature gradient of a liquid metal interface is not limited to being substantially normal to the surface of a mirror.

The operations associated with the various methods of the present invention may vary widely. Steps may be added, removed, altered, combined, and reordered without departing from the spirit or the scope of the present invention. By way of example, cavities or wells in mirror blocks may be filled with liquid metal after the mirror blocks are coupled to a base plate, instead of before the mirror blocks are coupled to the base plate.

The many features and advantages of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An apparatus comprising:
a heat exchanger, the heat exchanger including at least a first surface;
a mirror assembly, the mirror assembly including a first mirror block having a first mirrored surface, the mirror assembly having at least a first well defined therein, wherein the heat exchanger is separated from the mirror assembly; and
a first liquid metal interface, the first liquid metal interface including liquid metal, the liquid metal being contained in the at least first well, wherein the first surface is in contact with the liquid metal to transfer heat from the first mirror block to the heat exchanger and wherein the first surface of the heat exchanger is immersed in the liquid metal within the first well.

2. The apparatus of claim 1 wherein the mirror assembly further includes a base plate, the base plate being coupled to the first mirror block.

3. The apparatus of claim 2 wherein the at least first well is defined in the first mirror block.

4. The apparatus of claim 2 further including:
an optical element, wherein the optical element is coupled to the base plate.

5. The apparatus of claim 2 wherein the base plate includes a first structure and the first mirror block includes a second structure, the first structure and the second structure being arranged to couple the base plate to the first mirror block.

6. The apparatus of claim 5 wherein the second structure is a rib or a round boss.

7. The apparatus of claim 2 further including:
a second liquid metal interface including the liquid metal, wherein the mirror assembly further includes a second mirror block coupled to the base plate, the second mirror block having at least a second well defined therein, the liquid metal of the second liquid metal interface being contained in the at least second well.

8. The apparatus of claim 2 wherein the base plate and the first mirror block are coupled at an interface, the interface being a quasi-kinematic mount.

9. The apparatus of claim 1 wherein the heat exchanger includes at least a first prong, the first prong including the first surface, and wherein the first prong being at least partially positioned within the first well.

10. The apparatus of claim 1 wherein the liquid metal is a gallium alloy.

11. The apparatus of claim 1 wherein the liquid metal has an associated temperature gradient, wherein the temperature gradient is approximately normal to the first mirrored surface.

12. The apparatus of claim 1 further including:
an optical element, the optical element being coupled to the mirror assembly.

13. The apparatus of claim 1 wherein the apparatus is an extreme ultraviolet (EUV) lithography system.

14. A device manufactured with the EUV lithography system of claim 13.

15. The apparatus of claim 1 wherein the heat exchanger is not in direct contact with the mirror assembly.

16. The apparatus of claim 1 wherein the first liquid metal interface is an interface between the heat exchanger and the mirror assembly.

17. The apparatus of claim 1 wherein the first mirrored surface faces downwardly towards the heat exchanger.

18. The apparatus of claim 1 wherein the at least first well has a bottom surface, and wherein the first liquid metal interface is formed between the first surface of the heat exchanger and the bottom surface.

19. A method for assembling a cooling apparatus in an extreme ultraviolet (EUV) lithography system, the method comprising:
obtaining a mirror assembly, the mirror assembly having at least one cavity defined therein;
at least partially filling the at least one cavity with a liquid metal; and
positioning at least one surface of a heat exchanger in the at least one cavity, wherein positioning the at least one surface of the heat exchanger in the at least one cavity includes causing the at least one surface to contact the liquid metal, wherein the heat exchanger is separated from the mirror assembly.

20. The method of claim 19 wherein the mirror assembly includes a base plate and a mirror block, the base plate being coupled to an optical arrangement, the at least one cavity being defined in the mirror block.

21. The method of claim 20 further including:
assembling the mirror block to the base plate after at least partially filling the at least one cavity with the liquid metal.

22. The method of claim 21 wherein the at least one surface of the heat exchanger is associated with at least one prong of the heat exchanger, the at least one prong of the heat exchanger being arranged to pass through the base plate and into the at least one cavity.

23. The method of claim 19 wherein the heat exchanger is not in direct contact with the mirror assembly.

24. The apparatus of claim 19 wherein the mirror assembly includes a mirrored surface, the mirrored surface being arranged to face downwardly towards the heat exchanger.

25. A method for cooling a mirror arrangement in a lithography device, the method comprising:
transferring a heat load from a mirrored surface of the mirror arrangement to a liquid metal interface, the liquid metal interface being arranged between the mirror arrangement and a heat exchanger; and
transferring the heat load from the liquid metal interface to at least a first surface of the heat exchanger, wherein the first surface of the heat exchanger is immersed in the liquid metal interface within a first well.

26. The method of claim 25 wherein the first surface of the heat exchanger is associated with a prong of the heat exchanger and the liquid metal interface is arranged in a cavity defined in the mirror arrangement.

27. The method of claim 26 wherein the heat exchanger is not in direct contact with the mirror assembly, and wherein the prong of the heat exchanger is positioned within the cavity defined in the mirror arrangement.

28. The apparatus of claim 25 wherein the mirrored surface faces downwardly towards the heat exchanger.

* * * * *